United States Patent [19]
Caveney et al.

[11] Patent Number: 5,765,983
[45] Date of Patent: Jun. 16, 1998

[54] ROBOT HANDLING APPARATUS

[75] Inventors: Robert T. Caveney, Windham; Christopher A. Hofmeister, Hampstead, both of N.H.

[73] Assignee: Brooks Automation, Inc., Chelmsford, Mass.

[21] Appl. No.: 655,598

[22] Filed: May 30, 1996

[51] Int. Cl.$^6$ .................................................... B25J 9/06
[52] U.S. Cl. .................. 414/217; 414/744.5; 901/15; 74/490.01
[58] Field of Search ................ 414/217, 416, 414/744.5, 935, 937, 939; 901/15; 74/490.01, 490.03, 490.05, 490.06

[56] References Cited

U.S. PATENT DOCUMENTS

| | | | |
|---|---|---|---|
| 629,698 | 7/1899 | Miller . | |
| 1,204,276 | 11/1916 | Johnson . | |
| 2,580,829 | 1/1952 | Peck | 254/122 |
| 3,522,838 | 8/1970 | Ott | 164/404 |
| 3,730,595 | 5/1973 | Yakubowski | 302/2 R |
| 3,823,836 | 7/1974 | Cheney et al. | 214/16.4 R |
| 3,874,525 | 4/1975 | Hassan et al. | 214/17 B |
| 3,921,788 | 11/1975 | Roberson, Jr. et al. | 198/19 |
| 4,062,463 | 12/1977 | Hillman et al. | 214/301 |
| 4,139,104 | 2/1979 | Mink | 214/1 BB |
| 4,208,159 | 6/1980 | Uehara et al. | 414/225 |
| 4,218,173 | 8/1980 | Coindet et al. | 414/730 |
| 4,275,978 | 6/1981 | Brooks et al. | 414/156 |
| 4,295,780 | 10/1981 | Wada et al. | 414/749 |
| 4,507,044 | 3/1985 | Hutchins et al. | 414/744 R |
| 4,666,366 | 5/1987 | Davis | 414/749 |
| 4,730,976 | 3/1988 | Davis et al. | 414/749 |
| 4,897,015 | 1/1990 | Abbe et al. | 414/744.8 |
| 4,909,701 | 3/1990 | Hardegen et al. | 414/749 |
| 4,951,601 | 8/1990 | Maydan et al. | 118/719 |
| 5,007,784 | 4/1991 | Genov et al. | 414/225 |
| 5,049,029 | 9/1991 | Mitsui et al. | 414/939 X |
| 5,064,340 | 11/1991 | Genov et al. | 414/744.5 |
| 5,332,352 | 7/1994 | Poduje et al. | 414/744.5 X |
| 5,474,410 | 12/1995 | Ozawa et al. | 414/217 |

*Primary Examiner*—Donald W. Underwood
*Attorney, Agent, or Firm*—Perman & Green, LLP

[57] ABSTRACT

Robotic apparatus may be provided for handling workpieces such as semiconductor wafers within an integrated vacuum processing system and may be mounted within a vacuum load lock chamber adjacent a plurality of vacuum processing chambers. The apparatus includes an upper arm, a forearm, an end effector for supporting a wafer to be transported, and a wrist connecting the forearm to the end effector. The upper arm is rotatable in a level plane about an upright shoulder axis adjacent its inner end. A first coupling mechanism interconnects the forearm to the upper arm for mutual rotation about an elbow axis in a level plane. An end effector serves to support a wafer to be transported and a wrist connects the forearm to the end effector distant from the elbow axis. A second coupling mechanism interconnects the forearm to the wrist for their mutual rotation in a level plane about a wrist axis. Rotation of the upper arm moves the end effector between a retracted position and an extended position distant from the retracted position along a substantially straight line of travel and without change in its azimuthal orientation.

22 Claims, 5 Drawing Sheets

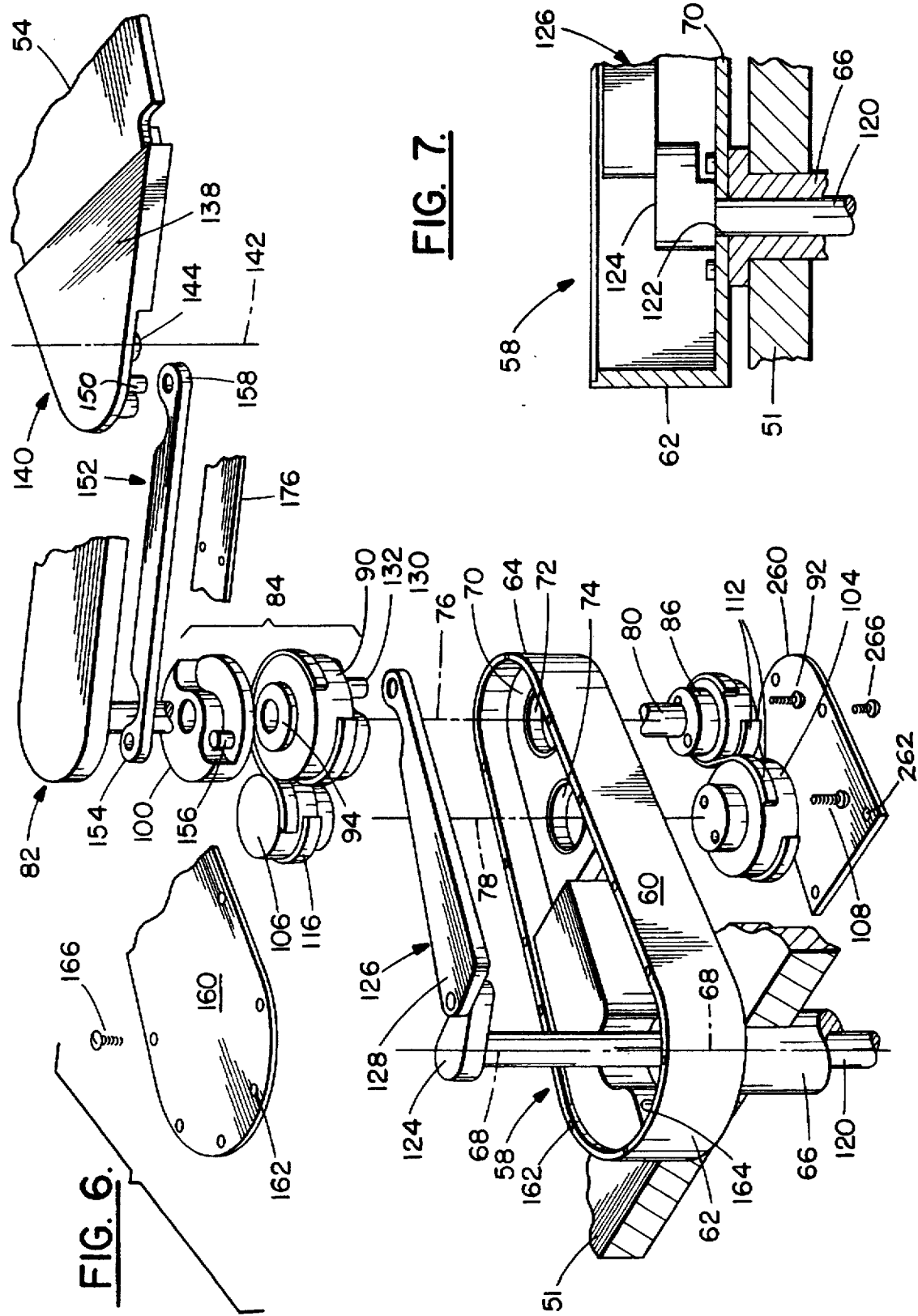

ROBOT HANDLING APPARATUS

BACKGROUND OF THE INVENTION

1. Field of the Invention

The present invention relates generally to material transfer devices, and more specifically to robotic apparatus for rapidly, efficiently, and carefully transferring payloads such as silicon wafers to and from a plurality of work stations.

2. Description of the Prior Art

The present invention is applicable for remotely transferring a wide variety of items from one location to another, although it may be of particular benefit for transferring silicon wafers and the like in the course of processing operations being performed on them.

The transfer of delicate silicon wafers or the like between a plurality of work stations or locations in the manufacture of semiconductor devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

U.S. Pat. No. 3,823,836 discloses an apparatus which includes a supply carrier with a plurality of ledges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.

U.S. Pat. No. 3,730,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejector acceptor arm controls the driving of the wafers into or out of the carrier from or on to the air slide, which moves the wafers to or from a work station.

U.S. Pat. Nos. 4,062,463, 3,974,525 and 4,208,159 also disclose wafer transfer devices which include either pneumatic components or gripping devices for handling the wafers.

U.S. Pat. No. 4,951,601 discloses an integrated vacuum process system which comprises a vacuum load lock chamber having a plurality of vacuum processing chambers mounted to the exterior thereof and communicating with the load lock chamber interior via selectively closable slits in the load lock and processing chambers. Each of the processing chambers can be adapted to perform one or more processes on silicon wafers and the like. Each processing chamber includes a robotic mechanism for reversibly transferring a wafer from a selected internal position adjacent the processing chamber opening to an internal wafer support. The load lock chamber incorporates a first external wafer elevator which is adapted for positioning wafers adjacent a load lock chamber entrance and a second internal elevator which is adapted for moving wafers to an internal position adjacent the entrance. A wafer handling robot is mounted within the load lock chamber and comprises a horizontal wafer-holding blade, a dual-four bar link mechanism mounting the blade. Concentric drive shafts effect rotation of the blade via the four-bar link mechanism to selectively position the blade at the processing chambers and elevators and, extend and retract the blade, also via the four-bar link mechanism, to position the blade at the elevators and at the selected internal positions in the processing chambers for loading and unloading wafers.

The above described devices of the prior art utilize relatively complex and costly mechanical and pneumatic components or utilize undesirable gripping devices which may cause damage to the delicate wafers. Moreover, the above described devices tend to be limited to the transfer of silicon wafers between fixed locations which are difficult to change.

In some other instances, drive belts or cables were used to transmit motion through the arm links to obtain the required motion. Undesirably, belts and cables tend to slip and stretch over time causing drift in position and repeatability problems.

Accordingly, there has been a need for a simple and reliable transfer device that will not damage the object and that is capable of transferring objects between a plurality of locations disposed in various axial and radial planes. The present invention provides a solution to the problem noted, replacing the belts and cables of known apparatus with rigid members connected in a unique manner.

SUMMARY OF THE INVENTION

The present invention which was conceived in light of the prior art as just described and has now been reduced to practice relates to apparatus for transferring an object such as a semiconductor wafer or flat panel between spaced locations. As will be described, robotic apparatus may be provided for handling workpieces such as semiconductor wafers within an integrated vacuum processing system and may be mounted within a vacuum load lock chamber adjacent a plurality of vacuum processing chambers. The apparatus includes an upper arm, a forearm, an end effector for supporting a wafer to be transported, and a wrist connecting the forearm to the end effector. The upper arm is rotatable in a level plane about an upright shoulder axis adjacent its inner end. A first coupling mechanism interconnects the forearm to the upper arm for mutual rotation about an elbow axis in a level plane. An end effector serves to support a wafer to be transported and a wrist connects the forearm to the end effector distant from the elbow axis. A second coupling mechanism interconnects the forearm to the wrist for their mutual rotation in a level plane about a wrist axis. Rotation of the upper arm moves the end effector between a retracted position and an extended position distant from the retracted position along a substantially straight line of travel and without change in its azimuthal orientation.

Accordingly, with this construction, a smaller package size for the transfer apparatus is achieved to assure rotational clearance with the sidewalls of ever more compact designs of processing stations for payloads such as semiconductor wafers. At the same time, the deflection of the articulated arms of the transfer apparatus is in the radial axis only with minimal pitch deflection in contrast to most known arm mechanisms.

Accordingly, a primary object of the invention is to provide a transfer mechanism which can reach to a maximum distance to retrieve a payload, yet retract to a minimal size for movement within the confines of the stations of a processing system. In other words, a primary object of the invention is to minimize the retracted rotational envelope of the transfer linkage thus allowing for smaller transport chambers which will minimize the system footprint. This result allows the process modules to move closer to the center of the rotational center of the robot thereby reducing the required extension while not sacrificing the amount of extension that the frog leg mechanism can achieve.

A further object of the invention is to provide such a transfer mechanism which is so constructed that deflections, when extended and under the weight of a payload, are minimized.

Another object of the invention is to provide such a transfer mechanism which is of simplified construction, uses materials which are commonly available, can be readily maintained, and can interface with existing processing systems.

Still another object of the invention is to provide such a transfer mechanism which eliminates belts and cables which tend to slip and stretch over time causing drift in position and repeatability problems.

A further object of the invention is to provide such a transfer mechanism which rapidly, yet in a smooth motion, advances the object being transferred.

Still a further object of the invention is to provide such a transfer mechanism which advances the object being transferred by means of an outer linkage which advances the object at a rate substantially greater than the rate of an inner linkage.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

BRIEF DESCRIPTION OF THE DRAWING

FIG. 6 is an exploded perspective view, from above, of the robotic handling apparatus of the present invention;

FIG. 7 is a detail cross section view, in elevation, illustrating a portion of the robotic handling apparatus illustrated in FIG. 6;

DETAILED DESCRIPTION OF THE PREFERRED EMBODIMENTS

Figure 1:
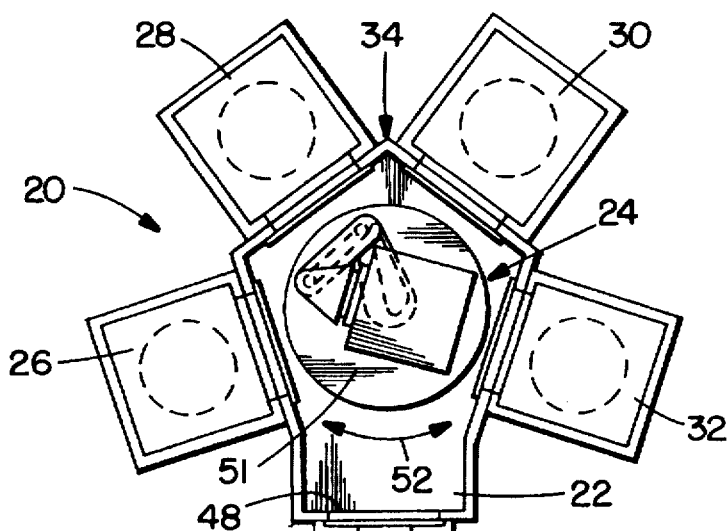
FIGS. 1 and 2 are top plan views diagrammatically illustrating a processing system for semiconductor devices utilizing an robotic handling apparatus embodying the present invention, two relative positions thereof being respectively depicted.
Figure 2:
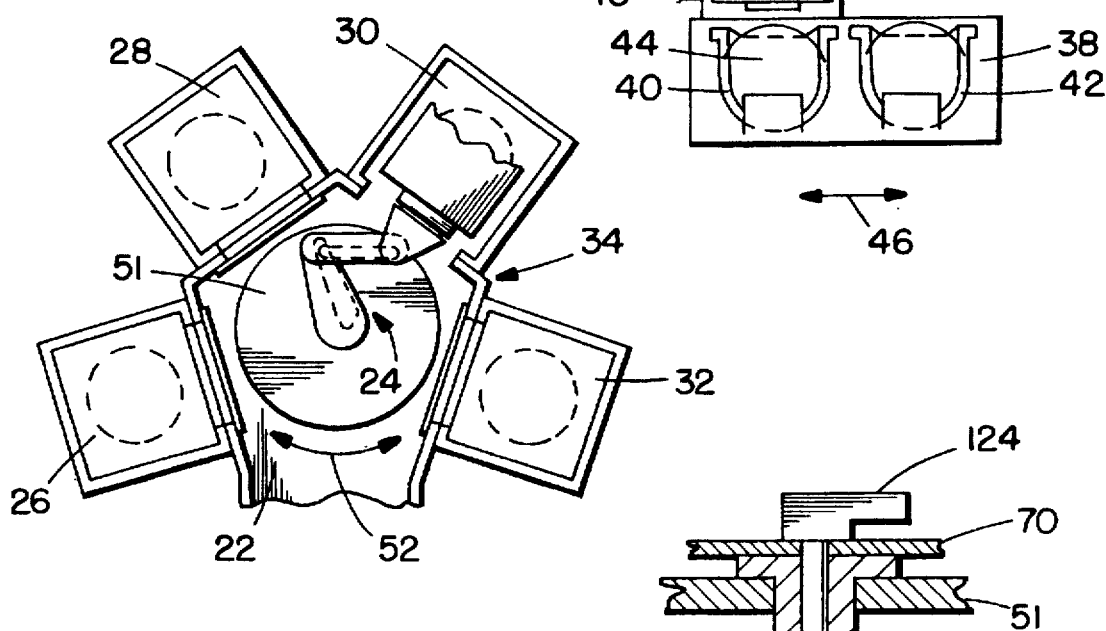

Turn now to the drawings and, initially, to FIGS. 1 and 2 which illustrates a multiple chamber silicon wafer (VLSI) processing system 20 that includes a common load lock 22, a wafer transport robot 24, and multiple process chambers 26, 28, 30, 32 suitable for sequentially and simultaneously performing different process steps such as deposition and/or dry etching of dielectric, semiconductor and conductor layers. The system 20 may be of the type which is capable of performing multiple integrated processing steps in a continuous sequence, that is, by routing semiconductor wafers between different processing chambers while the system is closed and under vacuum.

The system 20 comprises an enclosed, generally pentagonal main frame or enclosure 34 typically having sidewalls 36 that define the enclosed vacuum load lock 22. The individual vacuum processing reactors or chambers 26, 28, 30, 32 are mounted one each on an associated sidewall of the load lock. In a known manner, an external cassette elevator 38 is typically adapted for holding a pair of cassettes 40, 42 vertically oriented and each supporting a plurality of wafers 44 which are horizontally oriented. The external cassette elevator 38 is suitably mounted for reciprocal horizontal indexing movement, as indicated by arrow 46 (FIG. 1), to selectively position each cassette directly opposite and aligned with an opening 48 into the load lock chamber 22. The cassette elevator 38 is also suitably adapted for reciprocal vertical indexing movement to selectively present wafers within the cassette adjacent to the load lock opening 48. The process chambers 26, 28, 30, 32 and the associated sidewalls 36 have communicating openings 50 which may be similar or identical to the load lock opening 48.

Figure 3:
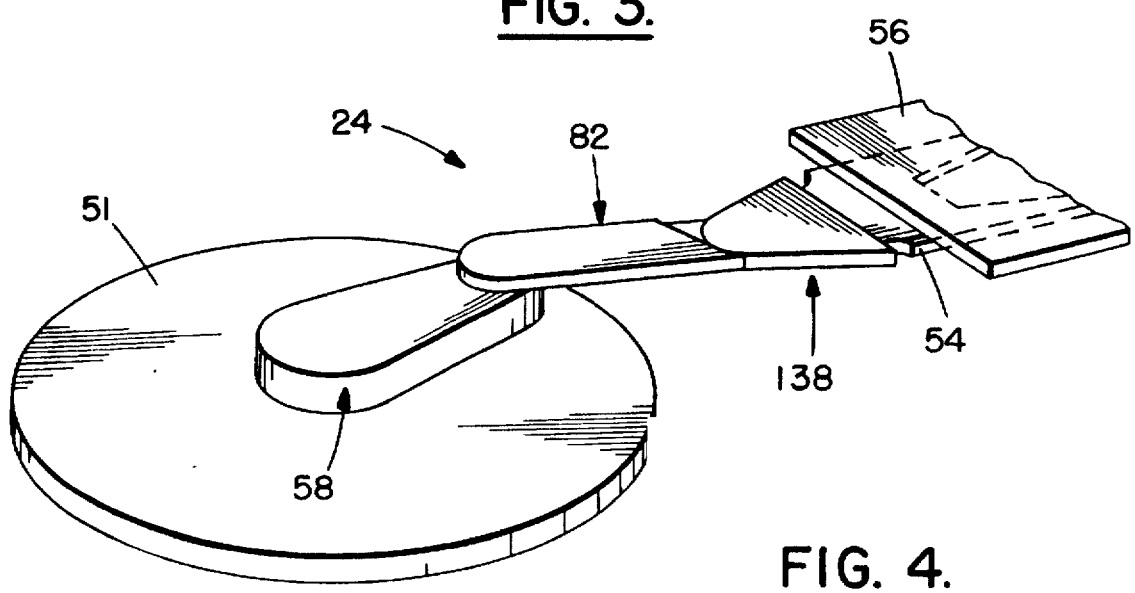
FIGS. 3 and 4 are detail perspective views respectively illustrating extended and retracted positions, respectively, of the robotic handling apparatus of the invention.
Figure 4:
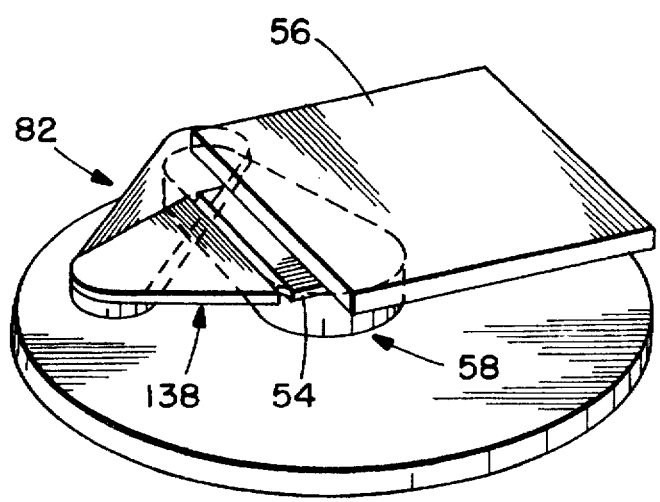

The present invention specifically relates to the wafer transport robot 24 which may be used in combination with the system 20, although it could be successfully operated in a variety of other environments. As seen in FIGS. 3 and 4, the transport robot 24 is capable of movement between an extended position (FIG. 3) and a retracted position (FIG. 4) and a sequence of movements between the retracted position and the extended position are illustrated, successively, in FIGS. 5A, 5B, 5C, and 5D. Also, as seen in FIGS. 1 and 2, the transport robot 24 can be rotated azimuthally on a platform 51 as indicated by double-headed arrow 52 so as to move an end effector 54 and its associated wafer platform 56 for alignment, as desired, with the opening 48 into the load lock chamber so as to receive a wafer 44 from the cassette 42 or with any of the openings 50 into any of the process chambers 26, 28, 30, 32 for delivering a wafer thereto or for retrieving a wafer therefrom. The specific mechanisms for achieving these movements will now be described.

The transport robot 24 thus includes an elongated upper arm 58 which is defined by a housing 60 which extends between inner and outer ends 62, 64, respectively, and is rotatable in a level plane. To this end, an upper arm shaft 66 is rotatably mounted (FIG. 7) on the platform 51 about an upright shoulder axis 68 and the upper arm is fixed on the upper arm shaft adjacent its inner end 62.

A base member 70 is integral with the housing 60 and has an elbow bore 72 therethrough adjacent the outer end 64 and an idler bore 74 therethrough intermediate the elbow bore and the inner end 62, the elbow bore being axially aligned with an elbow axis 76 and the idler bore being axially aligned with an idler axis 78.

Figure 8:
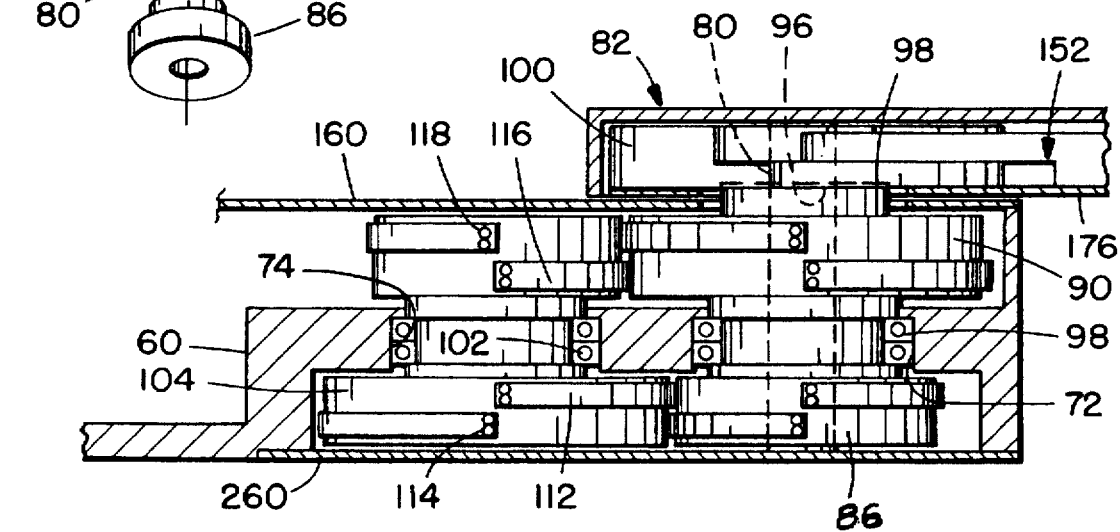
FIG. 8 is a detail elevation view, in cross section, illustrating part of the robotic handling apparatus illustrated in FIG. 6.

Viewing especially FIGS. 6 and 8, an elbow shaft 80 is positioned within the housing 60 and is aligned with the elbow axis 76 which is parallel to and spaced from the shoulder axis 68 in the direction of the outer end 64. As will be subsequently described in greater detail, a forearm 82 is mounted on the elbow shaft 80 for rotation in a level plane about the elbow axis adjacent the outer end 64. A floating pulley 84 is fixed on the elbow shaft 80 and is mounted on the upper arm 58 for rotation about the elbow axis 76. An elbow pulley 86, coaxial with the floating pulley 84, is also mounted on the elbow shaft and on the upper arm for rotation about the elbow axis 76. A suitable elbow bearing 88 is interposed within the elbow bore 72 for rotatably supporting the elbow pulley on the base member 70, although it will be understood that the elbow pulley 86 may simply be journaled in the elbow bore 72.

With continued reference to FIGS. 6 and 8, the floating pulley 84 is seen to include a lower segment 90 which is fixed to the elbow pulley 86 as by use of screw fasteners 92 for unitary rotation therewith. The lower segment may have an upwardly projecting cylindrical boss member 94 which fittingly mates with a similarly shaped downwardly facing cylindrical bore 96 partially defined by a circular wall 98 in an upper segment 100. With this construction, the upper segment 100, also received on the elbow shaft 80, is fixed on the lower segment 90, although both segments are together freely rotatable about the elbow axis 76.

A large diameter idler pulley 104 and a small diameter idler pulley 106 integral therewith, as by use of screw fasteners 108, are mounted on the upper arm 58 for rotation about the idler axis 78 which is parallel to and intermediate the shoulder axis 68 and the elbow axis 76. A suitable idler bearing 102 is interposed within the idler bore 74 for rotatably supporting the large diameter idler pulley 104 on the base member 70, although it will be understood that the idler pulley 104 may simply be journaled in the idler bore 74.

The large diameter idler pulley 104 and the elbow pulley 86 are suitably operatively interconnected such that they are caused to rotate in mutually opposite directions. This condition may be obtained by means of one or more elongated flexible straps 112 which extend between first and second opposed ends, respectively, and are engaged with the large diameter idler pulley and with the elbow pulley by means of rivets 114 or other suitable fasteners. Other expedients may be used, however, to interconnect the large diameter idler pulley and the elbow pulley and achieve the same result.

In a similar fashion, the small diameter idler pulley 106 and the lower segment 90 of the floating pulley 84 may be suitably operatively interconnected such that they also are caused to rotate in mutually opposite directions. Again, by way of example, this condition may be obtained by means of one or more elongated flexible straps 116 which extend between first and second opposed ends, respectively, and are engaged with the small diameter idler pulley and with the lower segment by means of rivets 118 or other suitable fasteners.

An upright shoulder shaft 120 which is held stationary during the extension and retraction mode of the wafer transport robot 24 is coaxial with the shoulder axis 68 and slidable in the upper arm shaft 66. It extends upwardly through an opening 122 in the base member 70 and an eccentric limb 124 extends transversely away from the shoulder shaft 120. An upper arm link 126 has a shoulder end 128 which is pivotally connected to the eccentric limb 124 at a location spaced from the shoulder axis 68 and an elbow end pivotally connected to the upper segment 100 of the floating pulley 84, specifically, to a downwardly projecting pin 132 at a location spaced from the elbow axis.

Figure 10:
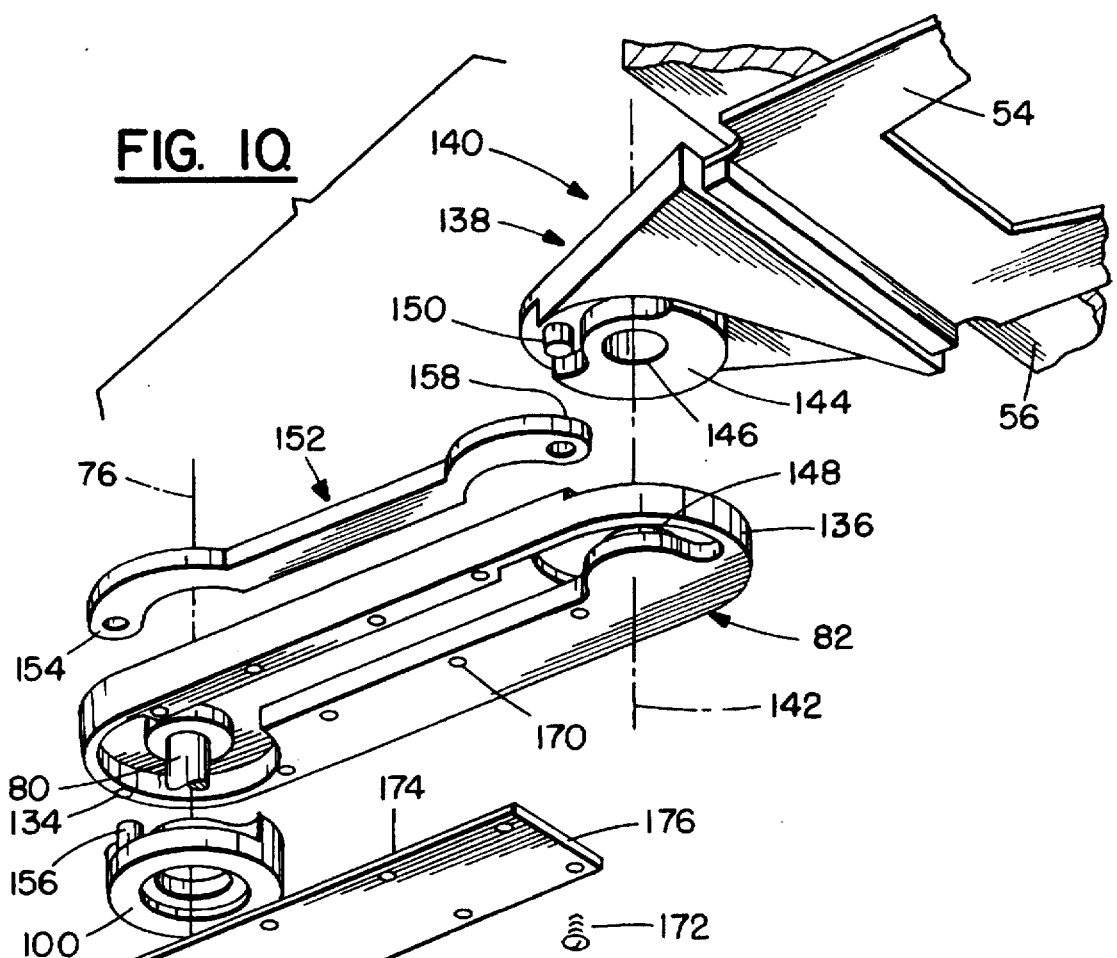
FIG. 10 is an exploded perspective view, from below, of portions of the robotic handling apparatus illustrated in FIG. 6.
Figure 11:
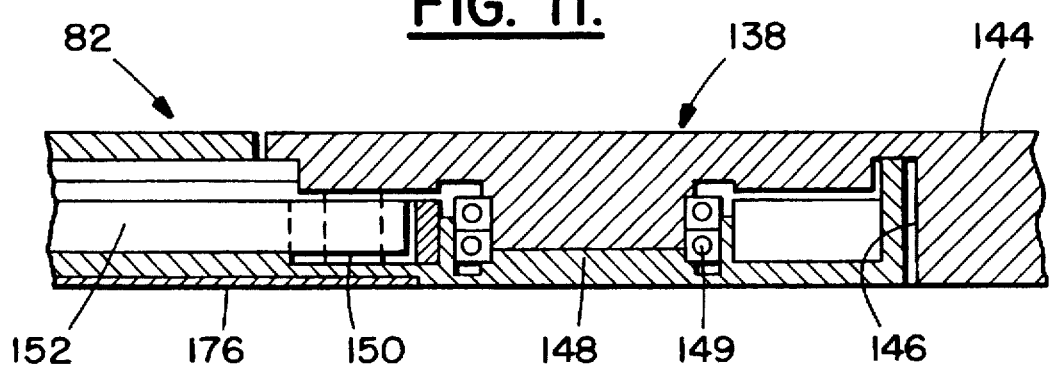
FIG. 11 is an elevation view, in cross section, illustrating in more detail of portions of the robotic handling apparatus illustrated in FIG. 10.

As seen particularly well in FIGS. 10 and 11, the forearm 82 extends between an elbow end 134 and a wrist end 136 which is pivotally coupled to a triangular-shaped wrist member 138. The end effector 54 supporting the wafer platform 56 is fixed to and extends away from the wrist member. A wrist coupling mechanism 140 pivotally interconnects the forearm 82 and the wrist member 138 for rotation about a wrist axis 142 which is parallel to and spaced from the elbow axis 76. The wrist coupling mechanism includes a downwardly projecting cylindrical boss member 144 defining a central bore 146 and an upwardly facing cylindrical projection 148 on the forearm 82 adjacent the wrist end 136 for slidable reception with the central bore. A bearing 149 is interposed between the cylindrical projection 148 and the boss member 144 for improved smoothness of operation. A wrist pin 150 on the wrist member 138 is spaced from the boss member 144 and extends parallel to the wrist axis. A forearm link 152 has an apertured elbow end 154 pivotally connected to an upstanding pin 156 on the upper segment 100 of the floating pulley 84 at a location spaced from the elbow axis 76 and an apertured wrist end 158 pivotally connected to the wrist pin 150 on the wrist member 138.

Figure 5A:
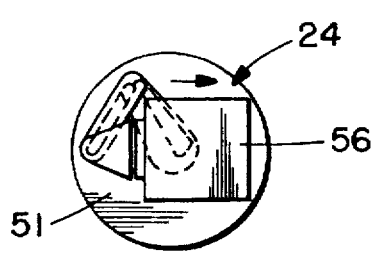
FIGS. 5A, 5B, 5C, and 5D are top plan views which diagrammatically illustrate a plurality of positions of the robotic handling apparatus of the invention, FIG. 5A depicting the retracted position, FIG. 5D depicting the extended position, and FIGS. 5B and 5C depicting intermediate positions.
Figure 5B:
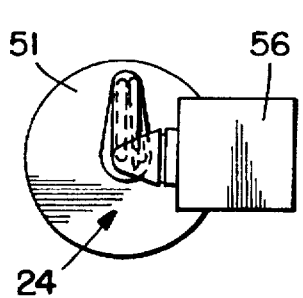
Figure 5C:
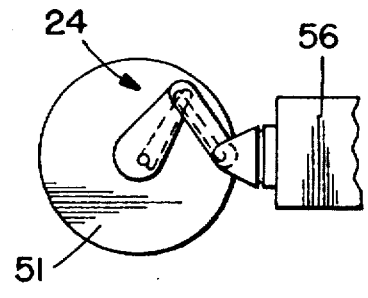
Figure 5D:
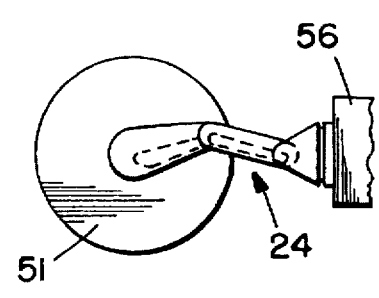

With the construction described, rotation of the upper arm 58 about the shoulder axis imparts angular rotational movement to the forearm about the elbow shaft 80 at a rate which is proportionally greater than that of the upper arm according to the ratio of the diameters of the large diameter idler pulley 104 to the small diameter idler pulley 106 and moves the wrist member 138 and its attached end effector 54 from a retracted position (FIGS. 4 and 5A), through intermediate positions (as seen in FIGS. 5B and 5C), to an extended position (FIGS. 3 and 5D) distant from the retracted position along a substantially straight line of travel and without change in the azimuthal orientation of the end effector. This result is achieved by reason of the fact that the four bar linkage comprising the forearm 82, forearm link 152, upper arm 58, and upper arm link 126 are so interconnected that, throughout their travel, the forearm and the forearm link remain parallel and the upper arm and upper arm link remain parallel.

To complete construction of the wafer transport robot 124, viewing FIG. 6, an upper arm cover plate 160 is provided to overlie the housing 60 which, in turn, has a plurality of tapped openings 162 at spaced locations along its upper rim 164 for threaded reception of screw fasteners 166 as they project through aligned openings 168 positioned along the peripheral edge of the upper arm cover plate. In a similar fashion, the underside of the upper arm 58 has a plurality of tapped openings (not shown) at spaced locations for threaded reception of screw fasteners 266 as they project through aligned openings 262 positioned along the peripheral edge of a forearm cover plate 260. Also, similarly, the underside of the forearm 82 has a plurality of tapped openings 170 at spaced locations for threaded reception of screw fasteners 172 as they project through aligned openings 174 positioned along the peripheral edge of a forearm cover plate 176.

Figure 9:
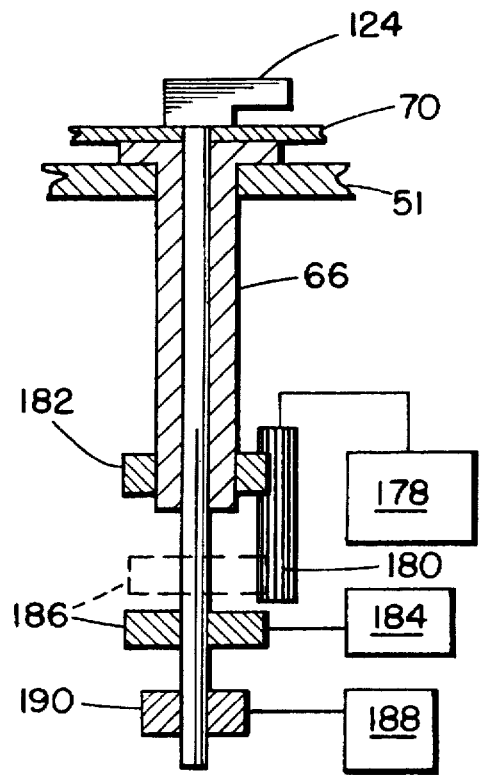
FIG. 9 is a detail cross section view illustrating another part of the robotic handling apparatus illustrated in FIG. 6.

It was earlier mentioned that the transport robot 24 can be rotated azimuthally on a platform 51 as indicated by double-headed arrow 52. By so doing, the end effector 54 and its associated wafer platform 56 can be moved for alignment, as desired, with the opening 48 into the load lock chamber so as to receive a wafer 44 from the cassette 42 or with any of the openings 50 into any of the process chambers 26, 28, 30, 32 for delivering a wafer thereto or for retrieving a wafer therefrom. One example of a mechanism for achieving these movements is illustrated in FIG. 9. As seen therein, a drive motor 178 is operatively coupled to a drive gear 180 which is engaged with an upper arm drive gear 182 fixed to shaft 66. A suitable clutch mechanism 184 is selectively operable to move a shoulder shaft drive gear 186 splined on the shoulder shaft 120 between a solid line, disengaged, position to a dashed line position engaged with the drive gear 180. An actuator 188 is also selectively operable, in one instance, to cause a suitable brake 190 to engage the shoulder shaft 120 and prevent its rotation when the gears 180 and 186 are disengaged and, in another instance, to cause the brake 190 to disengage from the shoulder shaft 120, thereby enabling its rotation. The former situation occurs when it is desired to extend the wafer transport robot 24 in the manner depicted in FIGS. 5A–5D; and the latter situation occurs when it is desired to rotate the wafer transport robot 24 in the manner depicted in FIGS. 1 and 2.

In the operation of the wafer transport robot 24, it will be appreciated that the elbow shaft 80 on the elbow axis 76 is caused to rotate about the center of the robot, that is, about the shoulder axis 68, in a fixed arc as the upper arm 58 rotates. The floating pulley 84 which is freely rotatable on the elbow shaft 80 is forced to rotate about the elbow axis 76 because the upper arm link 126 is grounded to a location which is off center from the center of rotation of the upper arm 58. Because the center distances of the upper arm 58 and of the upper arm link 126 are different, as the upper arm rotates, the two arcs that are swung, one being by the elbow axis 76 as it is rotating through space with the upper arm and the other being the location of attachment of the upper arm link 126 to the pin 132 of the lower segment 90 of the floating pulley 84, the floating pulley is forced to rotate. As a result, if an arc is swung from the center of rotation of the upper arm link 126 to the pin 132 and from the center of rotation (shoulder axis 68) of the upper arm 58 to the elbow shaft, those two arcs would converge at some point during the extension operation and then diverge as the arm continues to fully extend. This center distance, or this change in relationship of the two arcs, is what causes the floating pulley to rotate at the elbow shaft. In summary, the axis along the length of upper arm 58 and the axis along the length of upper arm link 126 are always parallel. The offset at the shoulder and its angle are therefore always parallel to the offset axis of the pin that is fixed to the floating pulley. Now, the forearm link 152 attaching to the wrist member 138 which is also pinned to that same floating pulley at pin 156 follows that rotational arc as well. Therefore, the wrist member 138 is forced to follow the relative motion of the links and of the floating pulley.

It is in light of the foregoing that rotation of the upper arm 58 about the shoulder axis 68 imparts angular rotational movement to the forearm about the elbow shaft 80 at a rate which is proportionally greater than that of the upper arm according to the ratio of the diameters of the large diameter idler pulley 104 to the small diameter idler pulley 106 and moves the end effector 54 between a retracted position and an extended position distant from the retracted position along a substantially straight line of travel and without change in the azimuthal orientation of the end effector.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. Robotic handling apparatus for transporting an object between spaced locations comprising:

an upper arm shaft rotatably mounted on a base about an upright shoulder axis;

an elongated upper arm having inner and outer ends fixed on said upper arm shaft adjacent said inner end and extending between said inner and outer ends and rotatable in a level plane;

an elbow shaft adjacent said outer end and having an upright elbow axis which is parallel to and spaced from said shoulder axis;

a forearm on said elbow shaft mounted for rotation in a level plane about said elbow axis adjacent said outer end, said forearm extending between an elbow end and a wrist end;

a floating pulley fixed on said elbow shaft and mounted on said upper arm for rotation about said elbow axis;

an elbow pulley mounted on said upper arm for rotation about said elbow axis and coaxial with said floating pulley;

a large diameter idler pulley and a small diameter idler pulley integral therewith mounted on said upper arm for rotation about an idler axis which is parallel to and intermediate said shoulder axis and said elbow axis;

means operatively interconnecting said large diameter idler pulley and said elbow pulley such that they are caused to rotate in mutually opposite directions;

means operatively interconnecting said small diameter idler pulley and said floating pulley such that they are caused to rotate in mutually opposite directions;

a stationary upright shoulder shaft coaxial with said shoulder axis;

an eccentric limb member on said shoulder shaft extending transversely thereof away from said shoulder axis;

an upper arm link having a shoulder end pivotally connected to said eccentric limb at a location spaced from said shoulder axis and an elbow end pivotally connected to said floating pulley at a location spaced from said elbow axis;

a wrist member;

an end effector fixed to and extending away from said wrist member for supporting an object;

wrist coupling means pivotally interconnecting said forearm and said wrist member for rotation about an upright wrist axis which is parallel to and spaced from said elbow axis;

a forearm link having an elbow end pivotally connected to said floating pulley at a location spaced from said elbow axis and a wrist end pivotally connected to said wrist member at a location spaced from said wrist axis;

whereby rotation of said upper arm about said shoulder axis imparts angular rotational movement to said forearm about said elbow shaft at a rate which is proportionally greater than that of said upper arm according to the ratio of the diameters of said large diameter idler pulley to said small diameter idler pulley and moves said end effector between a retracted position and an extended position distant from the retracted position along a substantially straight line of travel and without change in the azimuthal orientation of said end effector.

2. Robotic handling apparatus as set forth in claim 1 wherein said interconnecting means include elongated flexible strap means extending between and engaged at first and second opposed ends, respectively, with said large diameter idler pulley and with said elbow pulley and extending between and engaged at first and second opposed ends, respectively, with said small diameter idler pulley and with said floating pulley for imparting an angular rotational movement of said forearm about said elbow shaft relative to that performed by said upper arm about said shoulder axis which is proportional to the relative diameters of said large diameter idler pulley and said small diameter idler pulley.

3. Robotic handling apparatus as set forth in claim 1 wherein said upper arm includes;

a housing;

a base member integral with said housing and having an elbow bore therethrough adjacent said outer end and an idler bore therethrough intermediate the elbow bore and said inner end, the elbow bore axially aligned with said elbow axis and the idler bore being axially aligned with said idler axis;

elbow bearing means within the elbow bore for rotatably supporting said elbow pulley on said base member;

idler bearing means within the idler bore for rotatably supporting said idler pulley on said base member;

wherein said forearm includes an upwardly directed cylindrical projection;

wherein said wrist coupling means includes:

a downwardly projecting cylindrical boss member defining a central bore for slidable reception therein of said upwardly facing cylindrical projection.

4. Robotic handling apparatus as set forth in claim 1 wherein said floating pulley includes:

a lower segment fixed to said elbow pulley for unitary rotation therewith; and an upper segment fixedly received on said elbow shaft;

whereby said upper segment is rotatable with said lower segment about said elbow axis.

5. Robotic handling apparatus for transporting an object between spaced locations comprising:

elongated upper arm means extending between inner and outer ends and rotatable in a level plane about an upright shoulder axis adjacent said inner end;

elongated forearm means;

first coupling means interconnecting said forearm means to said upper arm means for mutual rotation thereof about an elbow axis in a level plane, said first coupling means including:

an elbow shaft having an upright axis aligned with said elbow axis which is parallel to and spaced from said shoulder axis;

a floating pulley fixed on said elbow shaft and mounted on said upper arm for rotation about said elbow axis;

an elbow pulley mounted on said upper arm for rotation about said elbow axis and coaxial with said floating pulley;

a large diameter idler pulley and a small diameter idler pulley integral therewith mounted on said upper arm for rotation about an idler axis which is parallel to and intermediate said shoulder axis and said elbow axis;

means operatively interconnecting said large diameter idler pulley and said elbow pulley such that they are caused to rotate in mutually opposite directions;

means operatively interconnecting said small diameter idler pulley and said floating pulley such that they are caused to rotate in mutually opposite directions;

a stationary upright shoulder shaft coaxial with said shoulder axis;

an eccentric limb member on said shoulder shaft extending transversely thereof away from said shoulder axis;

an upper arm link having a shoulder end pivotally connected to said eccentric limb at a location spaced from said shoulder axis and an elbow end pivotally connected to said floating pulley at a location spaced from said elbow axis;

wrist coupling means pivotally interconnecting said forearm and a wrist means for rotation about an upright wrist axis which is parallel to and spaced from said elbow axis; and a forearm link having an elbow end pivotally connected to said floating pulley at a location spaced from said elbow axis and a wrist end pivotally connected to an object support member;

whereby rotation of said upper arm about said shoulder axis imparts angular rotational movement to said forearm about said elbow shaft at a rate which is proportionally greater than that of said upper arm according to the ratio of the diameters of said large diameter idler pulley to said small diameter idler pulley;

an end effector for supporting an object to be transported;

said wrist means connecting said forearm means to said end effector distant from said elbow axis; and second coupling means interconnecting said forearm means to said wrist means for mutual rotation thereof in a level plane about a wrist axis;

whereby rotation of said upper arm moves said end effector between a retracted position and an extended position distant from the retracted position along a substantially straight line of travel and without change in its azimuthal orientation.

6. Robotic handling apparatus as set forth in claim 5 wherein said second coupling means includes:

an upwardly facing cylindrical projection on said forearm adjacent said wrist end and said wrist means including a downwardly projecting cylindrical boss member defining a central bore for the pivotal reception therein of said cylindrical projection.

7. Robotic handling apparatus as set forth in claim 5 wherein said interconnecting means include elongated flexible strap means extending between and engaged at first and second opposed ends, respectively, with said large diameter idler pulley and with said elbow pulley and extending between and engaged at first and second opposed ends, respectively, with said small diameter idler pulley and with said floating pulley for imparting an angular rotational movement of said forearm about said elbow shaft relative to that performed by said upper arm about said shoulder axis which is proportional to the relative diameters of said large diameter idler pulley and said small diameter idler pulley.

8. Robotic handling apparatus as set forth in claim 5 wherein said upper arm includes;

a housing;

a base member integral with said housing and having an elbow bore therethrough adjacent said inner end and an idler bore therethrough intermediate the elbow bore and said inner end, the elbow bore axially aligned with said elbow axis and the idler bore being axially aligned with said idler axis;

elbow bearing means within the elbow bore for rotatably supporting said elbow pulley on said base member;

idler bearing means within the idler bore for rotatably supporting said idler pulley on said base member;

wherein said forearm includes an upwardly directed cylindrical projection; and wherein said wrist coupling means includes:

a downwardly projecting cylindrical boss member defining a central bore for slidable reception of the upwardly facing cylindrical projection.

9. Robotic handling apparatus as set forth in claim 5 wherein said floating pulley includes:

a lower segment fixed to said elbow pulley for unitary rotation therewith; and an upper segment fixedly received on said elbow shaft;

whereby said upper segment is rotatable with said lower segment about said elbow axis.

10. An integrated vacuum processing system for workpieces such as semiconductor wafers comprising:

a vacuum load lock chamber having a closable entrance;

a plurality of vacuum processing chambers mounted to said load lock chamber and communicating therewith via openings into said adjacent processing chambers;

each of said processing chambers including a wafer support means and being adapted for performing a specialized process on a wafer positioned on said support means; and wafer handling robotic apparatus mounted within said load lock chamber comprising:

an upper arm shaft rotatably mounted on a base about an upright shoulder axis;

an elongated upper arm having inner and outer ends fixed on said upper arm shaft adjacent said inner end and extending between said inner and outer ends and rotatable in a level plane;

an elbow shaft adjacent said outer end and having an upright elbow axis which is parallel to and spaced from said shoulder axis;

a forearm on said elbow shaft mounted for rotation in a level plane about said elbow axis adjacent said outer end, said forearm extending between an elbow end and a wrist end;

a floating pulley fixed on said elbow shaft and mounted on said upper arm for rotation about said elbow axis;

an elbow pulley mounted on said upper arm for rotation about said elbow axis and coaxial with said floating pulley;

a large diameter idler pulley and a small diameter idler pulley integral therewith mounted on said upper arm for rotation about an idler axis which is parallel to and intermediate said shoulder axis and said elbow axis;

means operatively interconnecting said large diameter idler pulley and said elbow pulley such that they are caused to rotate in mutually opposite directions;

means operatively interconnecting said small diameter idler pulley and said floating pulley such that they are caused to rotate in mutually opposite directions;

a stationary upright shoulder shaft coaxial with said shoulder axis;

an eccentric limb member on said shoulder shaft extending transversely thereof away from said shoulder axis;

an upper arm link having a shoulder end pivotally connected to said eccentric limb at a location spaced from said shoulder axis and an elbow end pivotally connected to said floating pulley at a location spaced from said elbow axis;

a wrist member;

an end effector fixed to and extending away from said wrist member for supporting a wafer thereon;

wrist coupling means pivotally interconnecting said forearm and said wrist member for rotation about an upright wrist axis which is parallel to and spaced from said elbow axis;

a forearm link having an elbow end pivotally connected to said floating pulley at a location spaced from said elbow axis and a wrist end pivotally connected to said wrist member at a location spaced from said wrist axis;

whereby rotation of said upper arm about said shoulder axis imparts angular rotational movement to said forearm about said elbow shaft at a rate which is proportionally greater than that of said upper arm according to the ratio of the diameters of said large diameter idler pulley to said small diameter idler pulley and moves said end effector between a retracted position and an extended position distant from the retracted position along a substantially straight line of travel and without change in the azimuthal orientation of said end effector.

11. An integrated vacuum processing system as set forth in claim 10 wherein said interconnecting means include elongated flexible strap means extending between and engaged at first and second opposed ends, respectively, with said large diameter idler pulley and with said elbow pulley and extending between and engaged at first and second opposed ends, respectively, with said small diameter idler pulley and with said floating pulley for imparting an angular rotational movement of said forearm about said elbow shaft relative to that performed by said upper arm about said shoulder axis which is proportional to the relative diameters of said large diameter idler pulley and said small diameter idler pulley.

12. An integrated vacuum processing system as set forth in claim 10 wherein said upper arm includes;

a housing;

a base member integral with said housing and having an elbow bore therethrough adjacent said inner end and an idler bore therethrough intermediate the elbow bore and said inner end, the elbow bore axially aligned with said elbow axis and the idler bore being axially aligned with said idler axis;

elbow bearing means within the elbow bore for rotatably supporting said elbow pulley on said base member;

idler bearing means within the idler bore for rotatably supporting said idler pulley on said base member;

wherein said forearm includes an upwardly directed cylindrical projection; and wherein said wrist coupling means includes:

a downwardly projecting cylindrical boss member defining a central bore for slidable reception therein of said upwardly facing cylindrical projection.

13. An integrated vacuum processing system as set forth in claim 10 wherein said floating pulley includes:

a lower segment fixed to said elbow pulley for unitary rotation therewith; and an upper segment fixedly received on said elbow shaft;

whereby said upper segment is rotatable with said lower segment about said elbow axis.

14. An integrated vacuum processing system as set forth in claim 10 including:

operating means for selectively aligning said robotic apparatus with one of said processing chambers and, when said robotic apparatus has been properly aligned, for moving said end effector to said extended position.

15. An integrated vacuum processing system as set forth in claim 14 wherein said operating means includes:

a forearm shaft integral with said forearm and coaxial with and slidably received on said shoulder shaft;

drive means engageable with said forearm shaft and with said shoulder shaft for rotating both said forearm shaft and said shoulder shaft about said shoulder axis; and clutch means for selectively engaging said drive means with only said forearm shaft axis in one instance and, in another instance, for selectively engaging said drive means with both said forearm shaft and said shoulder shaft as a unit.

16. An integrated vacuum processing system for workpieces such as semiconductor wafers comprising:

a vacuum load lock chamber having a closable entrance;

a plurality of vacuum processing chambers mounted to said load lock chamber and communicating therewith via openings into said adjacent processing chambers;

each of said processing chambers including a wafer support means and being adapted for performing a specialized process on a wafer positioned on said support means; and wafer handling robotic apparatus mounted within said load lock chamber comprising:

elongated upper arm means extending between inner and outer ends and rotatable in a level plane about an upright shoulder axis adjacent said inner end;

elongated forearm means;

first coupling means interconnecting said forearm means to said upper arm means for mutual rotation thereof about an elbow axis in a level plane, said first coupling means including:

an elbow shaft having a longitudinal axis which is said elbow axis which is parallel to and spaced from said shoulder axis;

a floating pulley fixed on said elbow shaft and mounted on said upper arm for rotation about said elbow axis;

an elbow pulley mounted on said upper arm for rotation about said elbow axis and coaxial with said floating pulley;

a large diameter idler pulley and a small diameter idler pulley integral therewith mounted on said upper arm for rotation about an idler axis which is parallel to and intermediate said shoulder axis and said elbow axis;

means operatively interconnecting said large diameter idler pulley and said elbow pulley such that they are caused to rotate in mutually opposite directions;

means operatively interconnecting said small diameter idler pulley and said floating pulley such that they are caused to rotate in mutually opposite directions;

a stationary upright shoulder shaft coaxial with said shoulder axis;

an eccentric limb member on said shoulder shaft extending transversely thereof away from said shoulder axis;

an upper arm link having a shoulder end pivotally connected to said eccentric limb at a location spaced from said shoulder axis and an elbow end pivotally connected to said floating pulley at a location spaced from said elbow axis;

wrist coupling means pivotally interconnecting said forearm means and a wrist means for rotation about an upright wrist axis which is parallel to and spaced from said elbow axis;

a forearm link having an elbow end pivotally connected to said floating pulley at a location spaced from said elbow axis and a wrist end pivotally connected to said end effector;

whereby rotation of said upper arm about said shoulder axis imparts angular rotational movement to said forearm about said elbow shaft at a rate which is proportionally greater than that of said upper arm according to the ratio of the diameters of said large diameter idler pulley to said small diameter idler pulley;

an end effector for supporting a wafer to be transported;

said wrist means connecting said forearm means to said end effector distant from said elbow axis; and second coupling means interconnecting said forearm means to said wrist means for mutual rotation thereof in a level plane about a wrist axis;

whereby rotation of said upper arm moves said end effector between a retracted position and an extended position distant from the retracted position along a substantially straight line of travel and without change in its azimuthal orientation.

17. An integrated vacuum processing system as set forth in claim 16 wherein said second coupling means includes:

an upwardly facing cylindrical projection on said forearm adjacent said wrist end and said wrist means including a downwardly projecting cylindrical boss member defining a central bore for slidable reception therein of said cylindrical projection.

18. An integrated vacuum processing system as set forth in claim 16 wherein said interconnecting means include elongated flexible strap means extending between and engaged at first and second opposed ends, respectively, with said large diameter idler pulley and with said elbow pulley and extending between and engaged at first and second opposed ends, respectively, with said small diameter idler pulley and with said floating pulley for imparting an angular rotational movement of said forearm about said elbow shaft relative to that performed by said upper arm about said shoulder axis which is proportional to the relative diameters of said large diameter idler pulley and said small diameter idler pulley.

19. Robotic handling apparatus as set forth in claim 16 wherein said upper arm includes:

a housing;

a base member integral with said housing and having an elbow bore therethrough adjacent said inner end and an idler bore therethrough intermediate the elbow bore and said inner end, the elbow bore axially aligned with said elbow axis and the idler bore being axially aligned with said idler axis;

elbow bearing means within the elbow bore for rotatably supporting said elbow pulley on said base member;

idler bearing means within the idler bore for rotatably supporting said idler pulley on said base member;

wherein said forearm includes an upwardly directed cylindrical projection; and wherein said wrist coupling means includes:

a downwardly projecting cylindrical boss member having a central bore for pivotally receiving said upwardly facing cylindrical projection.

20. Robotic handling apparatus as set forth in claim 16 wherein said floating pulley includes:

a lower segment fixed to said elbow pulley for unitary rotation therewith, said lower segment having an upwardly projecting cylindrical boss member; and an upper segment fixedly received on said elbow shaft;

whereby said upper segment is rotatable with said lower segment about said elbow axis.

21. An integrated vacuum processing system as set forth in claim 16 including:

operating means for selectively aligning said robotic apparatus with one of said processing chambers and, when said robotic apparatus has been properly aligned, for moving said end effector to said extended position.

22. An integrated vacuum processing system as set forth in claim 21 wherein said operating means includes:

a forearm shaft integral with said forearm and coaxial with and slidably received on said shoulder shaft;

drive means engageable with said forearm shaft and with said shoulder shaft for rotating both said forearm shaft and said shoulder shaft about said shoulder axis; and clutch means for selectively engaging said drive means with only said forearm shaft axis in one instance and, in another instance, for selectively engaging said drive means with both said forearm shaft and said shoulder shaft as a unit.

* * * * *